United States Patent
Vanselow et al.

(10) Patent No.: US 10,962,997 B2
(45) Date of Patent: Mar. 30, 2021

(54) APPARATUS AND METHOD FOR DRIVING A LOAD AND DEVICE

(71) Applicant: Fraunhofer-Gesellschaft zur Förderung der angewandten Forschung e.V., Munich (DE)

(72) Inventors: Frank Vanselow, Attenkirchen (DE); Bernadette Kinzel, Taufkirchen/Vils (DE); Erkan Isa, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 173 days.

(21) Appl. No.: 16/218,742

(22) Filed: Dec. 13, 2018

(65) Prior Publication Data

US 2019/0113940 A1 Apr. 18, 2019

Related U.S. Application Data

(63) Continuation of application No. PCT/EP2016/066134, filed on Jul. 7, 2016.

(51) Int. Cl.
*G05F 1/56* (2006.01)
*H02M 3/156* (2006.01)
(Continued)

(52) U.S. Cl.
CPC ............. *G05F 1/56* (2013.01); *F04B 43/046* (2013.01); *G05F 1/44* (2013.01); *H01L 41/042* (2013.01); *H02M 3/156* (2013.01)

(58) Field of Classification Search
CPC ........... G05F 1/56; G05F 1/44; H01L 41/042; H02M 3/156; F04B 43/046
See application file for complete search history.

(56) References Cited

U.S. PATENT DOCUMENTS

| 6,111,335 A * | 8/2000 | Acatrinei | G01R 29/22 310/316.03 |
| 2009/0021110 A1 * | 1/2009 | Lendaro | H02N 2/147 310/317 |

FOREIGN PATENT DOCUMENTS

| DE | 10 2012 208 756 A1 | 11/2012 |
| GB | 1 245 708 A | 9/1971 |

(Continued)

OTHER PUBLICATIONS

Japanese Office Action dated Jan. 7, 2020, issued in application No. 2019-500359.
(Continued)

*Primary Examiner* — Daniel J Cavallari
(74) *Attorney, Agent, or Firm* — McClure, Qualey & Rodack, LLP

(57) ABSTRACT

The invention refers to an apparatus for driving a load with a drive signal. The apparatus includes an AC voltage source, a DC voltage source, a capacitor and a control apparatus. The AC voltage source outputs an AC voltage. The DC voltage source outputs a DC voltage. The capacitor includes a first terminal and a second terminal. The AC voltage source is connected to the first terminal, and a signal output is connected to the second output. The control apparatus controls, depending on a voltage present at the signal output, a connection between the DC voltage source and the second terminal. Furthermore, the invention refers to a corresponding method as well as to a device.

16 Claims, 7 Drawing Sheets

(51) Int. Cl.
      *F04B 43/04*       (2006.01)
      *G05F 1/44*       (2006.01)
      *H01L 41/04*       (2006.01)

(56) References Cited

FOREIGN PATENT DOCUMENTS

| | | |
|---|---|---|
| JP | 2004248353 A | 9/2004 |
| JP | 2012246821 A | 12/2012 |

OTHER PUBLICATIONS

Japanese Office Action dated Aug. 4, 2020, issued in application No. 2019-500359.
Gunnar Gnad: "Ansteuerkonzepte für piezoelektrische Aktoren"; Dissertation; Jun. 2005.
International Search Report and Written Opinion dated Apr. 10, 2017 for PCT/EP2016/066134 (and English translation of International Search Report).
International Preliminary Report on Patentability dated Jun. 4, 2018 for PCT/EP2016/066134.

\* cited by examiner

APPARATUS AND METHOD FOR DRIVING A LOAD AND DEVICE

CROSS-REFERENCE TO RELATED APPLICATION

This application is a continuation of copending International Application No. PCT/EP2016/066134, filed Jul. 7, 2016, which is incorporated herein by reference in its entirety.

BACKGROUND OF THE INVENTION

The invention refers to an apparatus for driving a load with a drive signal and to a corresponding method. Furthermore, the invention refers to a device comprising, in particular, a load to be driven.

In general, an (electronic) load is a component, assembly or device that receives an (electrical) drive signal. Examples of loads are actuators (or driving elements) that convert electrical drive signals into mechanical motion or into other physical quantities—e.g. pressure or temperature—and thus actively affect processes or components.

For example, piezo actuators comprising at least one piezoelectric element are special actuators. They take advantage of the fact that some solid bodies comprise a relationship between a change in electrical polarization—and therefore the occurrence of an electrical voltage at the solid body—and elastic deformation. According to another example, the load is a part of a sensor that is activated by the drive signal and whose measuring behavior is influenced by the drive signal.

One field of application for piezo actuators are micropumps. Micropumps are pumps for conveying liquids, gases or free-flowing substances that have been generated using micro system technology methods. The piezo actuators move—using the inverse piezo effect—diaphragms in order to convey the media in certain directions.

An AC voltage signal with a high positive amplitude (up to several hundred volts) and a small negative amplitude (down to −100 volts) is usually used for driving the piezo actuators. Depending on the application, the magnitude values of the two amplitudes differ and are independent of each other, resulting in an asymmetrical drive signal. With micropumps, the amplitudes are to be specified, e.g., depending on the thickness of the piezoelectric element on the diaphragm.

Furthermore, for example in micropumps, certain applications—e.g. medical applications—involve that the diaphragm electrically connected to the piezo actuator is contacted with the electrical ground potential. Thus, a differential drive of the piezo actuator, in which the two contact sides of the piezo element are each connected to an electrical drive circuit, is not possible.

In addition, it is advantageous if the electronic components for driving the micropumps are as compact as possible and are advantageously realized largely on an integrated circuit (IC). This simplifies application and use, e.g. in mobile phones or medical devices. Furthermore, in this way costs may be reduced and some applications are made possible in the first place.

Different concepts for driving piezo actuators are described, for example, in the dissertation by Gunnar Gnad, entitled "Ansteuerkonzepte für piezoelektrische Aktoren", from 2005.

SUMMARY

An embodiment may have an apparatus for driving a load with a drive signal, the apparatus including an AC voltage source, a DC voltage source, a capacitor and a control apparatus, wherein the AC voltage source is configured to output an AC voltage, wherein the DC voltage source is configured to output a DC voltage with a predeterminable magnitude, wherein the capacitor includes a first terminal and a second terminal, wherein the AC voltage source is connected to the first terminal, wherein a signal output is connected to the second terminal, and wherein the control apparatus is configured to control, depending on a voltage present at the signal output, a connection between the DC voltage source and the second terminal.

Another embodiment may have a device having at least a load and an apparatus for driving the load with a drive signal, wherein the apparatus includes an AC voltage source, a DC voltage source, a capacitor and a control apparatus, wherein the AC voltage source is configured to output an AC voltage, wherein the DC voltage source is configured to output a DC voltage with a predeterminable magnitude, wherein the capacitor includes a first terminal and a second terminal, wherein the AC voltage source is connected to the first terminal, wherein a signal output is connected to the second terminal, and wherein the control apparatus is configured to control, depending on a voltage present at the signal output, a connection between the DC voltage source and the second terminal.

Another embodiment may have a method for driving a load with a drive signal, having the steps of: generating an AC voltage, generating a DC voltage, applying the AC voltage to a first terminal of a capacitor, and applying the DC voltage to a second terminal of the capacitor depending on a voltage present at a signal output.

The apparatus comprises at least an AC voltage source, a DC voltage source, a capacitor and a control apparatus.

The AC voltage source is configured to output an AC voltage—advantageously in a predeterminable form with respect to the voltage curve and/or with respect to the magnitude of the amplitudes.

The DC voltage source is configured to output a DC voltage with a predeterminable magnitude.

The capacitor, which in one embodiment consists of one component and in another embodiment of several interconnected capacitor elements or of components with capacitive properties, comprises a first terminal and a second terminal.

The AC voltage source is connected to the first terminal. Furthermore, the signal output—and therefore indirectly also the load—is connected to the second terminal.

Finally, the control apparatus is configured to control, depending on an—electrical—voltage present at the signal output, a connection between the DC voltage source and the second terminal. Control of the connection means that the control apparatus essentially functions as a switch and, depending on the voltage present, connects the DC voltage source to the second terminal or opens such a connection. In an embodiment, the DC voltage source is connected in the connected state to the second terminal of the capacitor, to the signal output and to the load.

Through to the DC voltage, a reduction of the AC voltage results, so that a desired drive signal is generated. Or vice versa: the drive signal results from the reduction of the AC voltage using the DC voltage.

Depending on the voltage present at the signal outputs and therefore also at the load, the control apparatus connects or disconnects the DC voltage source. Thus, it acts in a voltage-limiting manner on the side of the capacitor with which the load to be driven is contacted.

In a further embodiment, a reduction of the control signal into the negative voltage range additionally results in connection with recharging the capacitor. In this case, a difference between the DC voltage and the positive amplitude of the AC voltage is utilized.

The voltage limit at which the control apparatus respectively switches may be specified by an external controller or may be specified, in an embodiment, through the circuitry, by the control apparatus comparing the voltage present at the signal output with the DC voltage of the DC voltage source.

Therefore, in an embodiment, the control apparatus consists of a comparator, and in a further embodiment, the control apparatus consists of at least one rectifier. In a dependent embodiment, the control apparatus comprises at least one diode.

In an embodiment, the drive signal is an AC voltage signal with a positive amplitude and a negative amplitude.

A magnitude of the positive amplitude of the drive signal depends on the magnitude of the DC voltage of the DC voltage source. In an embodiment, the magnitude of the positive amplitude is the essentially equal to the magnitude of the DC voltage. The magnitude of the DC voltage may be specified via the DC voltage source so that the positive amplitude of the drive signal may be specified via the DC voltage source in this embodiment. In this embodiment, the signal that depends on the AC voltage is thus lowered to the level of the DC voltage.

Furthermore, in an embodiment, a magnitude of the negative amplitude of the drive signal depends on a magnitude of a difference between a magnitude of a positive amplitude of the AC voltage of the AC voltage source and the magnitude of the DC voltage of the DC voltage source. In an embodiment, the magnitude of the negative amplitude of the drive signal is essentially equal to said difference. This difference is a degree by which the DC voltage of the DC voltage source and the positive amplitude of the AC voltage of the AC voltage source differ from each other. The difference between the positive amplitude of the AC voltage and the magnitude of the DC voltage therefore determines the degree of reduction of the AC voltage and thus also the negative amplitude of the excitation signal.

Overall, the apparatus causes the reduction of the generated AC voltage by the difference between the positive amplitude of the AC voltage and the magnitude of the DC voltage.

In an embodiment, the magnitudes of the positive amplitude and the negative amplitude of the AC voltage signal are different so that an asymmetrical drive signal is present. The advantage of this embodiment is that the apparatus makes it possible to generate a drive signal (or AC voltage signal) with amplitudes of different magnitudes, which does not occur in a differential manner but by generating a negative amplitude.

Alternatively, a symmetrical signal is provided in which the two magnitudes are equal.

An embodiment provides that the magnitude of the DC voltage of the DC voltage source is smaller than a magnitude of a positive amplitude of the AC voltage.

In an embodiment, the control apparatus is configured to connect the DC voltage source to the second terminal in the case in which the voltage present at the signal output is larger than the DC voltage or equal to the DC voltage of the DC voltage source. In this case, a voltage limitation takes place at the signal output depending on the control apparatus. This goes along with the fact that no voltage that is above the DC voltage of the DC voltage source may occur on this side of the capacitor, on which the load and/or the signal output is located.

In an embodiment, the AC voltage source comprises a controllable current source that generates an AC current. In addition, the current source (or specifically: the AC current source) is connected to the first terminal of the capacitor. Thus, in an embodiment, the current output of the current source is connected to the output to the AC voltage source and, in a further embodiment, the current output of the current source is the output of the AC voltage source.

In an embodiment, the current source comprises at least two current regulating circuits. In a further embodiment, the current regulating circuits may be separately driven. An example for a current regulating circuit is a current-mirror circuit. These are transistor circuits with which a further current may be derived from an existing reference current.

In a further embodiment, the AC voltage source comprises a DC voltage converter. The DC voltage converter, in an embodiment configured as a step-up converter, generates, based on a predetermined DC voltage, a drive voltage that, is larger than the predetermined DC voltage, in an embodiment. This drive voltage is supplied to the current source—particularly for its control. Thus, the current source generates a current signal that depends on the drive voltage. Therefore, the voltage of the AC current also corresponds to the drive voltage. Thus, e.g., with an actuator as a load, by operating the load via a current source, a mechanical stroke to be generated—e.g. that of a diaphragm—may be better controlled.

In an embodiment, the DC voltage converter is configured as a discontinuously operated step-up converter. A step-up converter (another designation is boost converter) is a DC voltage converter, the magnitude of the output voltage being larger than the magnitude of the input voltage.

According to an embodiment, the current source is configured to set an edge steepness of the AC voltage of the AC voltage source. The edge steepness—or slew rate—refers to the steepness or slope of the signal edges of a signal. In an embodiment, the slew rate is in particular the steepness of the edges between the positive amplitude of the AC voltage of the AC voltage source and the lower amplitude with 0 volts. Thus, the transition between the amplitudes is defined.

In an embodiment, the AC voltage source is configured such that the output AC voltage is free of a negative amplitude. In this embodiment, the AC voltage of the AC voltage source does not have negative voltage values; the negative voltage values of the drive signal are only generated through the reduction via applying the DC voltage. Therefore, one advantage of the apparatus is that a bipolar AC voltage is generated from a unipolar AC voltage.

Therefore, in an embodiment, the apparatus consists of a first part in which only positive voltages occur, and a second part which includes the actual reduction and in which the negative voltages of the drive signal are generated. In a resulting embodiment, the second part is separated from the first part because of the negative voltage.

According to an embodiment, the AC voltage source is configured such that the output AC voltage comprises a positive amplitude and an amplitude with 0 volts. In this embodiment, the AC voltage is also free of a negative voltage portion and switches between a positive amplitude and 0 volts. Thus, the lowest voltage of this AC voltage is 0 volts.

In an embodiment, the load is connected to a ground. Therefore, the load is grounded on one side. In an embodiment, this may be done, for example, with a piezo actuator as a load via a diaphragm in a micropump. The piezo actuator is advantageously used to generate the mechanical movements of the diaphragm and is also electrically coupled to the same. The one-sided connection of the load with the ground is possible since the apparatus for driving does not work in a differential manner, but generates a negative voltage.

In an embodiment, the load is characterized by capacitive properties. In an embodiment, this is accompanied by the fact that the capacitance of the capacitor is larger than the capacitance of the load. In an embodiment, the ratios of the capacitances are one to ten and, in a further embodiment, reach up to 1:100.

In an embodiment, the device comprises a charge pump. A charge pump is an electrical circuit that increases the magnitude of an electrical voltage. Charge pumps are generally used when large output currents are not required or when suitable magnetic components such as coils may not be used.

According to an embodiment, the control apparatus comprises at least one rectifier. In an embodiment, the control apparatus includes at least one diode which is connected on the cathode side to the DC voltage source and on the anode side to the signal output and, via the same, is indirectly connected to the second terminal of the capacitor. Through this arrangement, using the DC voltage of the DC voltage source, the control device reduces the signal present at the first terminal of the capacitor. Thus, this is a relatively simple embodiment.

In an embodiment, the control apparatus is realized as a common-mode control. In a—particularly linear—common-mode control, the mean between two different outputs is set to a reference value so that it is at the same time a level conversion.

In an embodiment of the common-mode control, there is an AC voltage coupling between the AC voltage generated by the AC voltage source and the load and/or signal output. In a measuring circuit—e.g. as part of the control apparatus—a DC voltage value at the signal output connected to the load is compared to a comparison value corresponding to the negative voltage to be set at the load and/or the signal output. For example, two current or voltage sources that are directly connected to the signal output are controlled via a resulting error signal or deviation signal.

In addition, the invention solves the object with a device having at least one load—to be driven—and an apparatus for driving the load with a drive signal—to be output via a signal output. The apparatus comprises an AC voltage source, a DC voltage source, a capacitor and a control apparatus. The AC voltage source is configured to output an AC voltage—advantageously in a predeterminable form. The DC voltage source is configured to output a DC voltage with a predeterminable amount. The capacitor comprises a first terminal and a second terminal, the AC voltage source being connected to the first terminal and a signal output of the apparatus being connected to the second terminal. Finally, the control apparatus is configured to control, depending on a voltage present at the signal output, a connection between the DC voltage source and the second terminal. The load to be driven is in contact with the signal output of the apparatus and therefore also with the second terminal of the capacitor.

In a further embodiment, the apparatus of the device is configured according to the above embodiments. Thus, the above discussions and explanations also apply here.

According to an embodiment, the load is a piezo actuator. Therefore, the load describes at least one piezoelectric element.

In an embodiment, the device is a micropump.

Overall, the above explanations and embodiments with respect to the apparatus for driving the load also apply to the device that includes such a load. Therefore, repetitions are omitted.

Alternatively, the apparatus may be used, for example, in an ultrasonic transducer or a haptic system or a measuring device as device.

Finally, the invention solves the object through a method for driving a load with a drive signal.

In this case, the load is advantageously to be connected to a signal output for outputting the drive signal.

The method at least includes the following steps:
Generating an AC voltage—advantageously with a predeterminable form.
Generating a DC voltage—advantageously with a predeterminable magnitude.
Applying the AC voltage to a first terminal of a capacitor.
Furthermore, applying, depending on a voltage present at a signal output, the DC voltage to a second terminal of the capacitor.

The signal output is advantageously connected to the second terminal of the capacitor.

With respect to the method, the above embodiments and discussions also apply to the apparatus and vice versa. In particular, the method may also be used to drive a load of a device.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
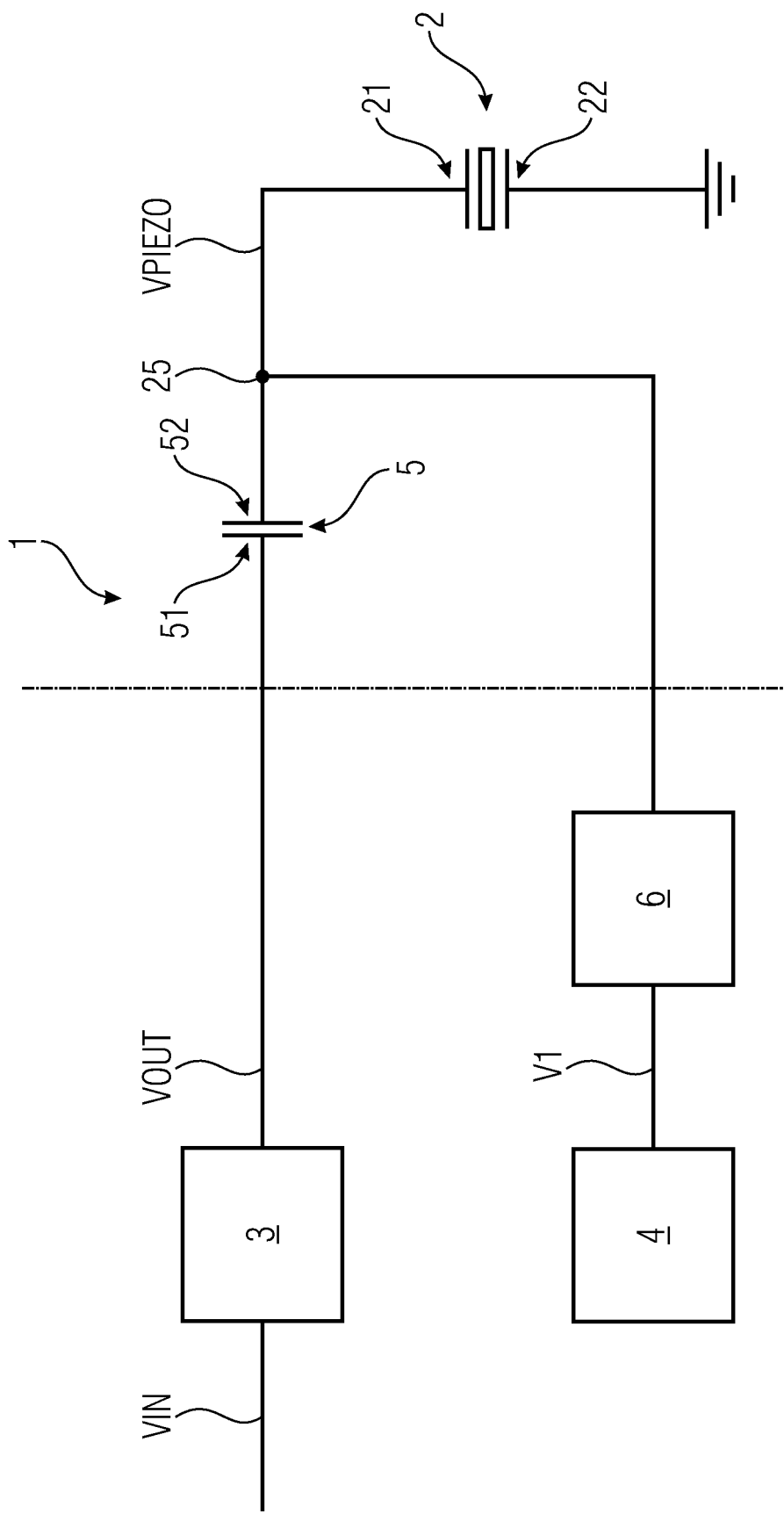
FIG. 1 shows a schematic structure of an inventive apparatus for driving a load as a block-circuit diagram in a first variation.

FIG. 1 shows a schematic structure of an embodiment of the inventive apparatus 1 driving a load 2, which is exemplarily configured as a piezo actuator, with a drive signal VPIEZO. The drive signal VPIEZO is an AC voltage signal and comprises a positive amplitude and a negative amplitude. As an example, the amplitudes differ from each other with respect to their magnitudes (e.g., see FIG. 3). Thus, the drive signal or AC voltage signal VPIEZO for driving the load 2 is asymmetrical.

The load 2 is connected with a first contact 21 to the apparatus 1 via a node as a signal output 25 in order to be driven by the apparatus 1. Furthermore, the load 2 is connected with a second contact 22 to a ground. In practice, the second contact 22 is, e.g., the side that is mechanically coupled to an object to be moved, e.g., a diaphragm (e.g., see FIG. 7).

The apparatus 1 comprises an AC voltage source 3 which generates, in the example shown, an AC voltage VOUT from a DC voltage VIN which originates from a battery, for example. For this, the AC voltage source 3 comprises an inductive asynchronous step-up converter that is operated discontinuously, for example.

In the example shown, the resulting AC voltage VOUT comprises a positive amplitude with the magnitude VBST which is larger than the magnitude of the input voltage VIN, and comprises an amplitude that is zero volts. Thus, the AC voltage VOUT is free of a negative portion, i.e. there are no negative voltages. For example, the input voltage VIN is 5 V and the positive amplitude VBST is 100 V.

The AC voltage source 3 is connected to a first terminal 51—i.e. with a first side—of the capacitor 5 so that this side of the capacitor 5 is applied with the AC voltage VOUT.

In addition, the apparatus 1 comprises a DC voltage source 4 that outputs a DC voltage with a magnitude V1. This DC voltage V1 is connected to the second terminal 52 of the capacitor 5 via a control apparatus 6. The magnitude of the DC voltage V1 is advantageously smaller than the magnitude of the positive or upper amplitude of the AC voltage VOUT. Thus, |V1|<|VBST| advantageously applies. For the above example values, V1 equals 70 V.

The control apparatus 6 connects the DC voltage source 4 to the signal output, i.e. the node 25, and therefore to the second source of the capacitor 5 via the second terminal 52, depending on a voltage present at the signal output 25 and therefore also at the load 2.

In an embodiment, if the positive voltage at the signal output 25 exceeds the magnitude of the DC voltage, the DC voltage source 4 is connected to the second terminal 52 of the capacitor 5. With this, the capacitor 5 charges at a higher positive voltage of the AC voltage source 3 to the difference between the magnitude of the positive amplitude of the AC voltage VOUT and the—in this example smaller—magnitude of the—in this case also positive—DC voltage V1. The voltage difference dV, here given by dV=VBST−V1, is in the case of the capacitor 5 reversing its charge the magnitude by which the AC voltage VOUT is reduced in order to generate the drive signal VPIEZO.

If the voltage at node 25 drops again, the control apparatus 6 simultaneously acting as a switch opens the connection between the DC voltage source 4 and the node 25, or the second terminal 52 of the capacitor 5.

Thus, an AC voltage VOUT is present at one side of the capacitor 5, and a DC voltage V1 is at least temporarily present at another side. This leads to a reduction of the AC voltage VOUT by the magnitude of the DC voltage V1. This also leads to the amplitude of an exemplary AC voltage VOUT with 0 volts resulting in a negative voltage which is applied to the load 2. For the example, the negative voltage is therefore −30 V, since dV=VBST−V1=100−70. This results in the overall AC voltage signal VPIEZO having the amplitudes with different magnitudes.

Here, the dashed-dotted line separates the areas of the apparatus 1 which comprise only positive voltages (here the left side) and which comprise positive and negative voltages (the right side). In an embodiment, this separation with regard to the properties is used to divide the apparatus 1 into two areas or parts.

Figure 2:
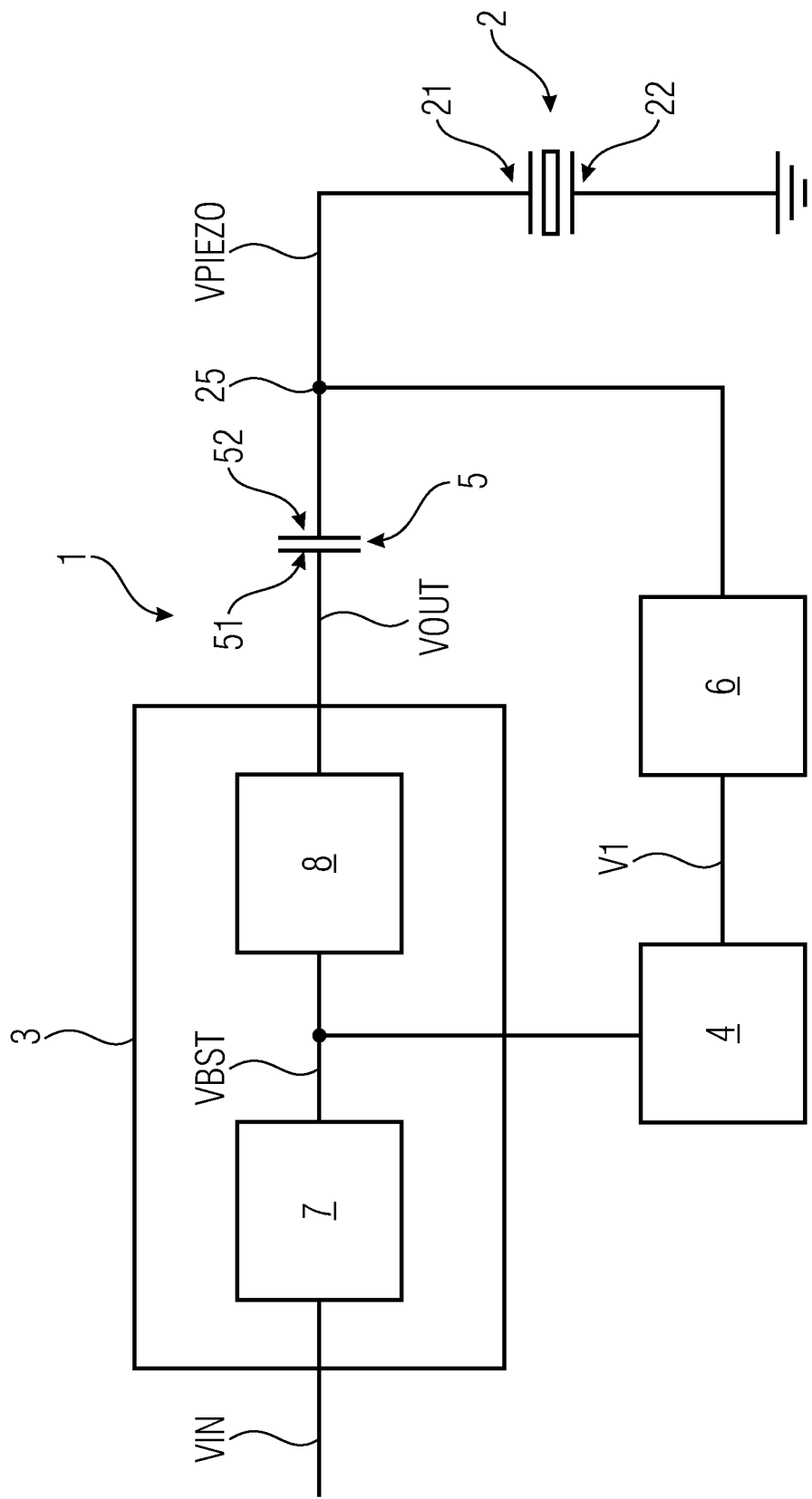
FIG. 2 shows a schematic structure of a second variation of the inventive apparatus.

FIG. 2 shows a further embodiment of the apparatus 1. The structure is basically similar to that of the apparatus of FIG. 1. There are two differences in the embodiment of the AC voltage source 3 and in the fact that there is a connection between the AC voltage source 3 and the DC voltage source 4. These two differences are explained below. For the rest of the circuit, reference is made to the discussions with respect to FIG. 1.

Here, the AC voltage source 3 comprises a DC voltage converter 7, which is, for example, a step-up converter. Such a DC voltage converter 7 converts from an input voltage VIN a higher drive voltage VBST. This drive (AC) voltage VBST is supplied to a current source 8 that generates an AC current signal. This results in the AC voltage VOUT at the output of the AC voltage source 3 and therefore also at the first terminal 51 of capacitor 5.

Furthermore, the drive voltage VBST also reaches the DC voltage source 4. For example, this saves the use of an additional, e.g., external, voltage source and energy source.

Figure 3:
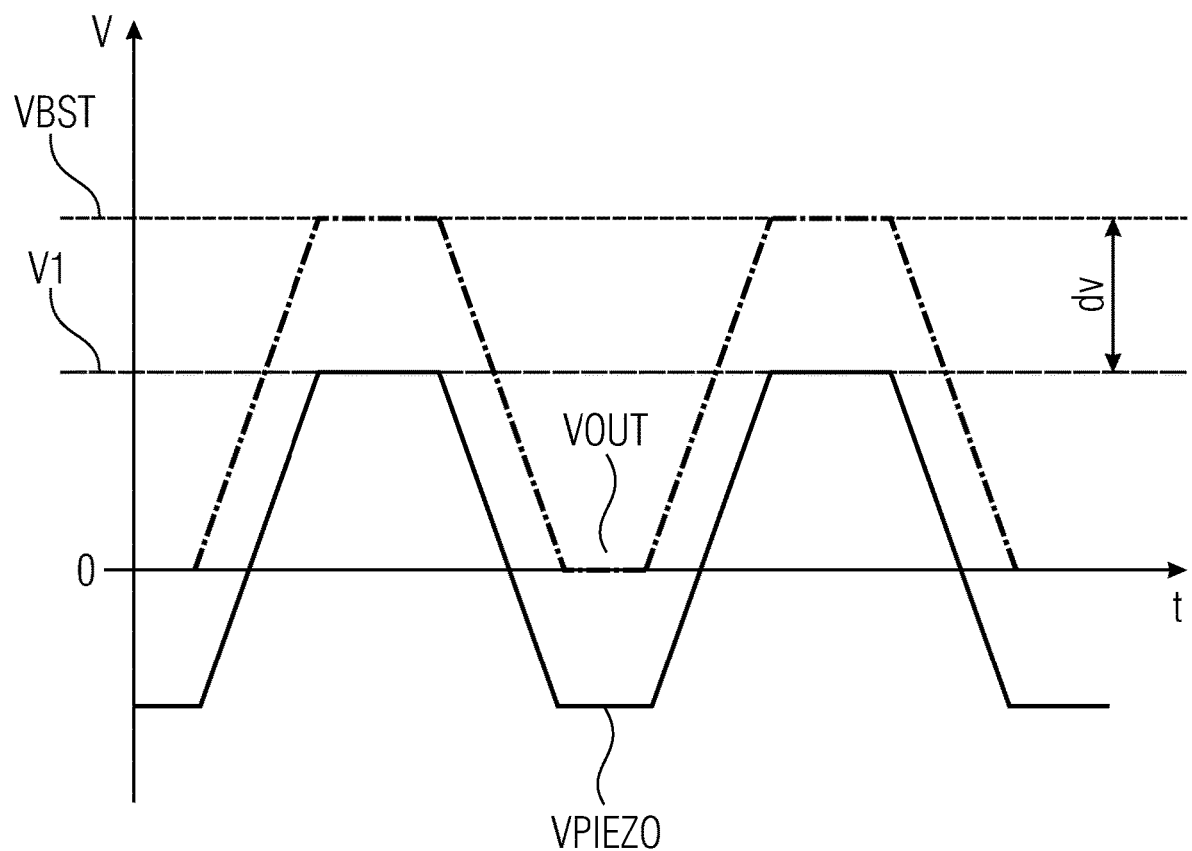
FIG. 3 shows a schematic progression of signals of the apparatus.

In FIG. 3, the progressions of several signals of the apparatus of FIG. 2 are schematically plotted. The voltage (V) is plotted on the Y-axis and the time (t) is plotted on the X-axis.

The drive voltage VBST of the DC voltage converter 7 and the DC voltage V1 of the DC voltage source 4 are illustrated. Both DC voltages VBST and V1 are larger than zero.

Furthermore, VBST is the magnitude of the upper amplitude of the AC voltage VOUT comprising on the one hand this upper amplitude VBST and on the other hand the lower amplitude with 0 V. The current source 8 allows setting the steepness of the edges of this AC voltage signal VOUT.

On the other hand, V1 is the magnitude of the DC voltage by which the output signal VOUT is reduced. Between the values VBST and V1, there is the difference dV=VBST−V1. The magnitude of the upper amplitude of the AC voltage VOUT is larger than the magnitude of the DC voltage V1.

The reduction results in the AC voltage signal VPIEZO which is supplied to the load 2 via the signal output 25. The AC voltage signal VPIEZO comprises a positive amplitude corresponding to the magnitude of the DC voltage V1. Furthermore, the AC voltage signal VPIEZO comprises a negative amplitude which, in the example shown, equals the difference between VBST and V1.

On the basis of the signal progressions of FIG. 3, the embodiments of FIGS. 1 and 2 may be understood such that, up to the first contact 51 of the capacitor 5, there are no negative voltages, and such that these are only generated across the capacitor 5 through the reduction by the difference between the voltages dV=VBST−V1.

Figure 4:
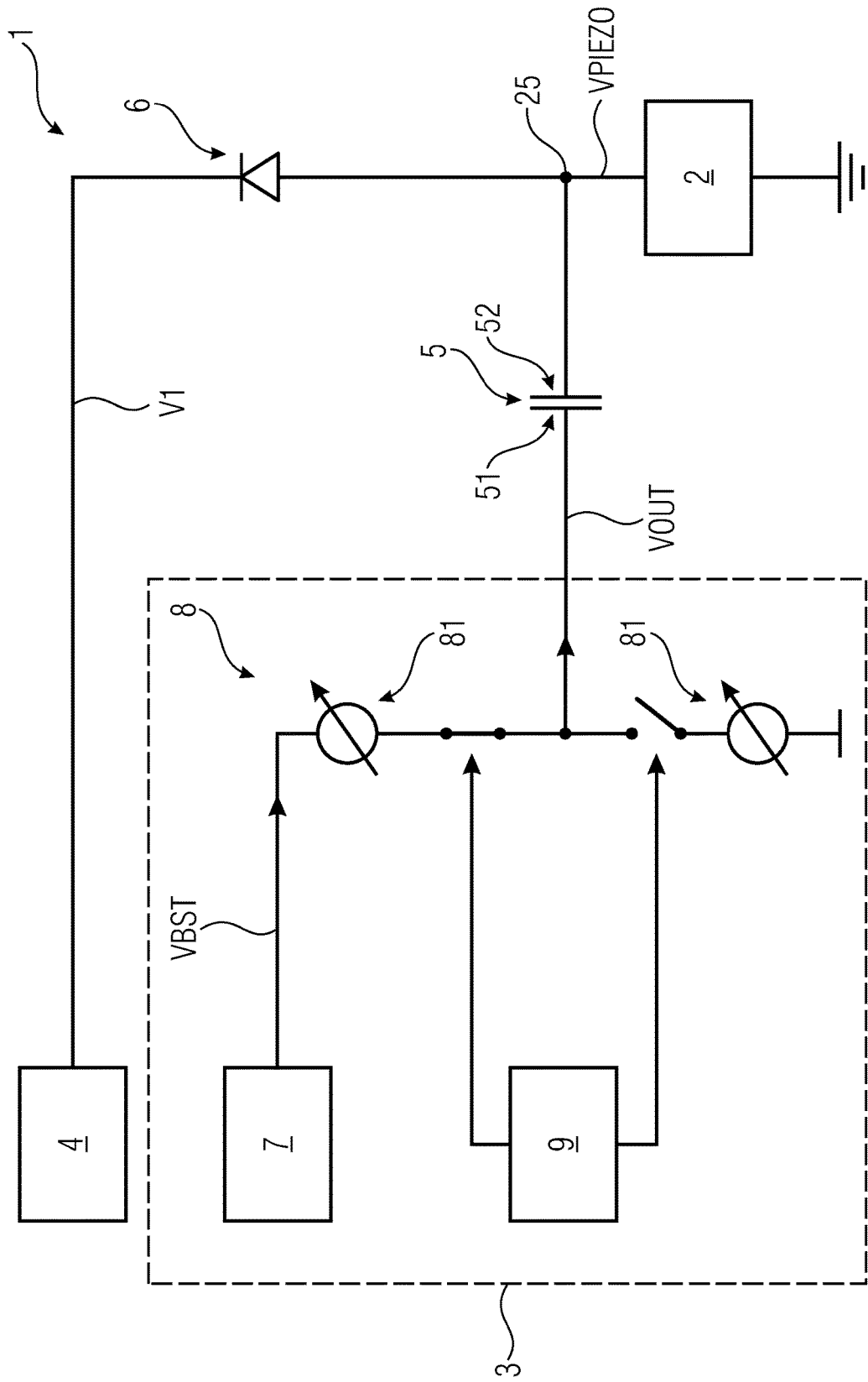
FIG. 4 shows a schematic structure of a third variation of the inventive apparatus in a first phase.
Figure 5:
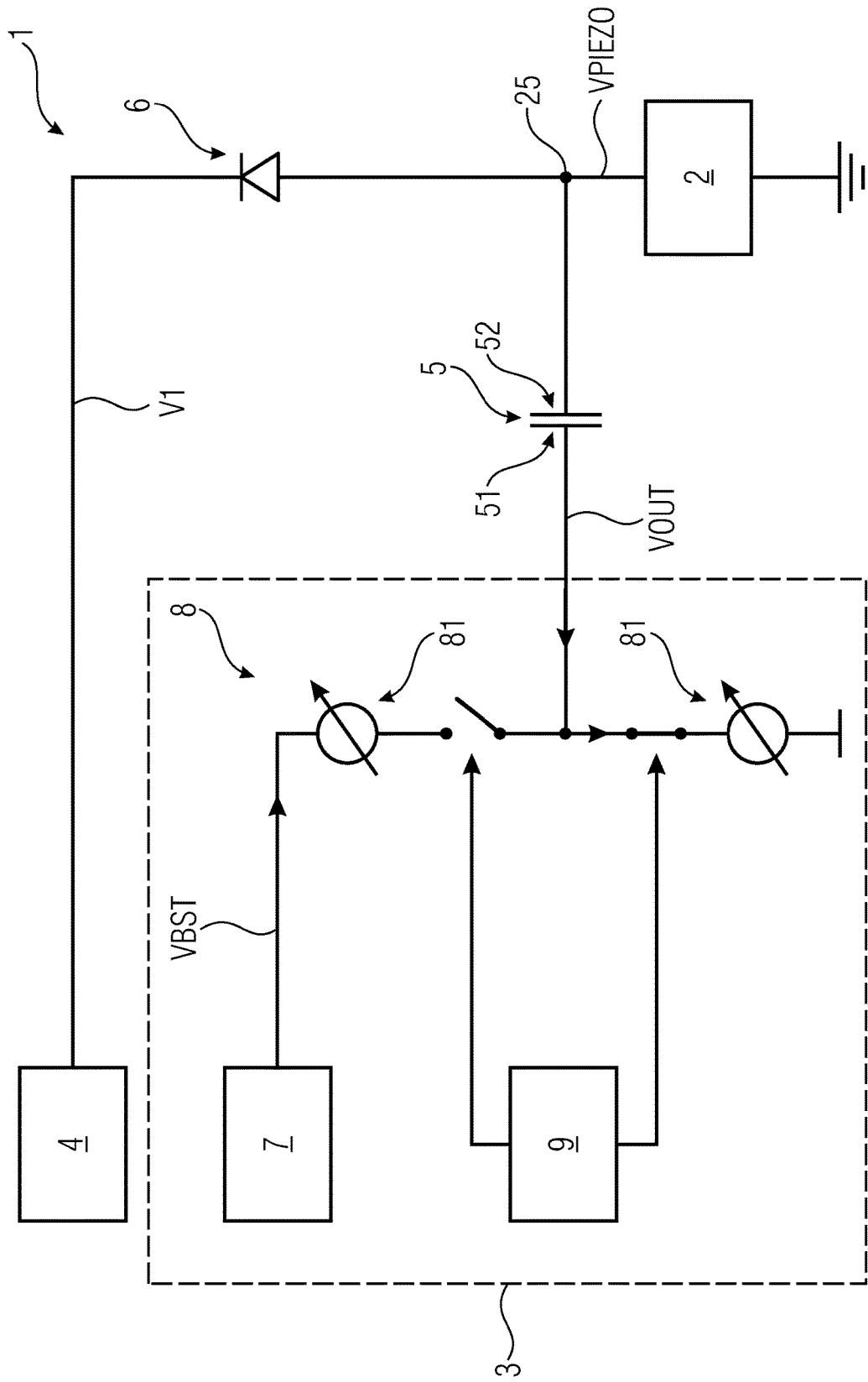
FIG. 5 shows the apparatus of FIG. 4 in a second phase.

The functioning of the apparatus 1 is explained based on a further embodiment with the illustrations of FIG. 4 and FIG. 5, which each refer to different phases.

The apparatus 1 illustrated in both illustrations of FIGS. 4 and 5 is connected via a node 25 as a signal output to a load 2 which is additionally connected to the ground. The load 2 is therefore not driven in a differential manner, but the apparatus 1 provides a drive signal VPIEZO in the form of an AC voltage with a positive and negative amplitude.

The apparatus 1 comprises a DC voltage source 4 which generates a DC voltage with the positive magnitude V1 shown here. Furthermore, the apparatus 1 comprises an AC voltage source 3 which outputs an AC voltage signal VOUT with two amplitudes. In addition, a control apparatus 6 and a capacitor 5 are associated with the apparatus 1.

The AC voltage VOUT generated by the AC voltage apparatus 3 is directed to a side 51 of the capacitor 5. The DC voltage V1 of the DC voltage source 4 reaches the other side 52 of the capacitor 5 via the control apparatus 6 which simultaneously serves as voltage-controlled switch. The electrical load 2 is connected to the side 52 of the capacitor 5, to which the DC voltage V1 is applied, in order to obtain the drive signal VPIEZO. The load 2 and the DC voltage source 4 are connected to the second terminal 52 via the same node which here also functions as a signal output. However, this may also be two different physical nodes, or terminals.

Herein, the control apparatus 6 is configured as a diode—as an example for a rectifier—which blocks if the voltage at the node 25 and therefore also at the load 2 is below the DC voltage V1 of the DC voltage source 4. In the blocked state of the diode 6, the switch in the form of the control apparatus 6 is open.

If the voltage at the node 25 is essentially equal to the DC voltage V1 or larger than the DC voltage V1, the switch 6 is closed and the DC voltage source 4 is connected to the second terminal 52 of the capacitor 5.

The AC voltage source 3 comprises a DC voltage converter 7 which serves as a voltage source for a drive voltage VBST. The embodiment as a DC voltage converter, or in particular as a step-up converter, has the advantage that a significantly smaller input voltage is sufficient, which is supplied by a battery, for example.

This drive voltage VBST is supplied to a current source 8 which here comprises two current regulating circuits 81. The current regulating circuits 81 represent current sources which may be individually regulated. Both current regulating circuits 81 each comprise a switch that connects them to a node leading to the signal output of the AC voltage source 3 and therefore to the first terminal 51 of the capacitor 5. The upper current regulating circuit 81 shown here is connected to the DC voltage converter 7 and to the output node. The other current regulating circuit 81 contacts on the one hand the ground and on the other hand the output node.

A controller 9 acts on the two switches of the current source 8, opening and closing both switches alternately. This alternation results in an AC voltage which causes the AC voltage VOUT at the capacitor 5.

In the phase shown in FIG. 4, the upper switch is closed and the lower switch is open so that the DC voltage converter 7 contacts the first terminal 51 of the capacitor 5 via the upper current regulating circuit 81. To illustrate the current flow, two arrows are shown on the lines.

In this phase, the capacitor 5 is being charged. On the other side of the capacitor 5, the control apparatus 6 reacts only at the moment when the value of the DC voltage V1 of the DC voltage source 4 is reached. At this moment, the control apparatus 6 connects the DC voltage source 4 to the node 25 and therefore to the second terminal 52 of the capacitor 5.

Since the magnitude of the drive voltage VBST of the DC voltage converter 7 is larger than the magnitude of the DC voltage V1, a voltage dV results at the capacitor 5, which is equal to the difference between the drive voltage VBST and the DC voltage V1. Loss effects are to be neglected here.

In turn, a drive signal VPIEZO which has an amplitude in this phase that is equal to the DC voltage V1 of the DC voltage source 4 is applied to the load 2. Therefore, a voltage limitation is given for the phase in which the positive components of the drive signal VPIEZO are generated.

In the next phase, which is shown in FIG. 5, the upper switch of the current source 8 is open and the lower switch is closed. In this case, the DC voltage converter 7 is disconnected and the current flows from the capacitor 5 via the lower current regulating circuit 81 towards the ground. Again, this is indicated by two arrows on the lines.

The differential voltage dV continues to be output via the capacitor 5. If the differential voltage dV is smaller than the DC voltage V1 at the DC voltage source 4, the control apparatus 6 opens, so that just this differential voltage dV is present as negative voltage at the node 25 and therefore also at the load 2.

Thus, a drive signal VPIEZO comprising a negative amplitude is supplied to the load 2, wherein only positive voltages occur at most components of the apparatus 1.

Figure 6:
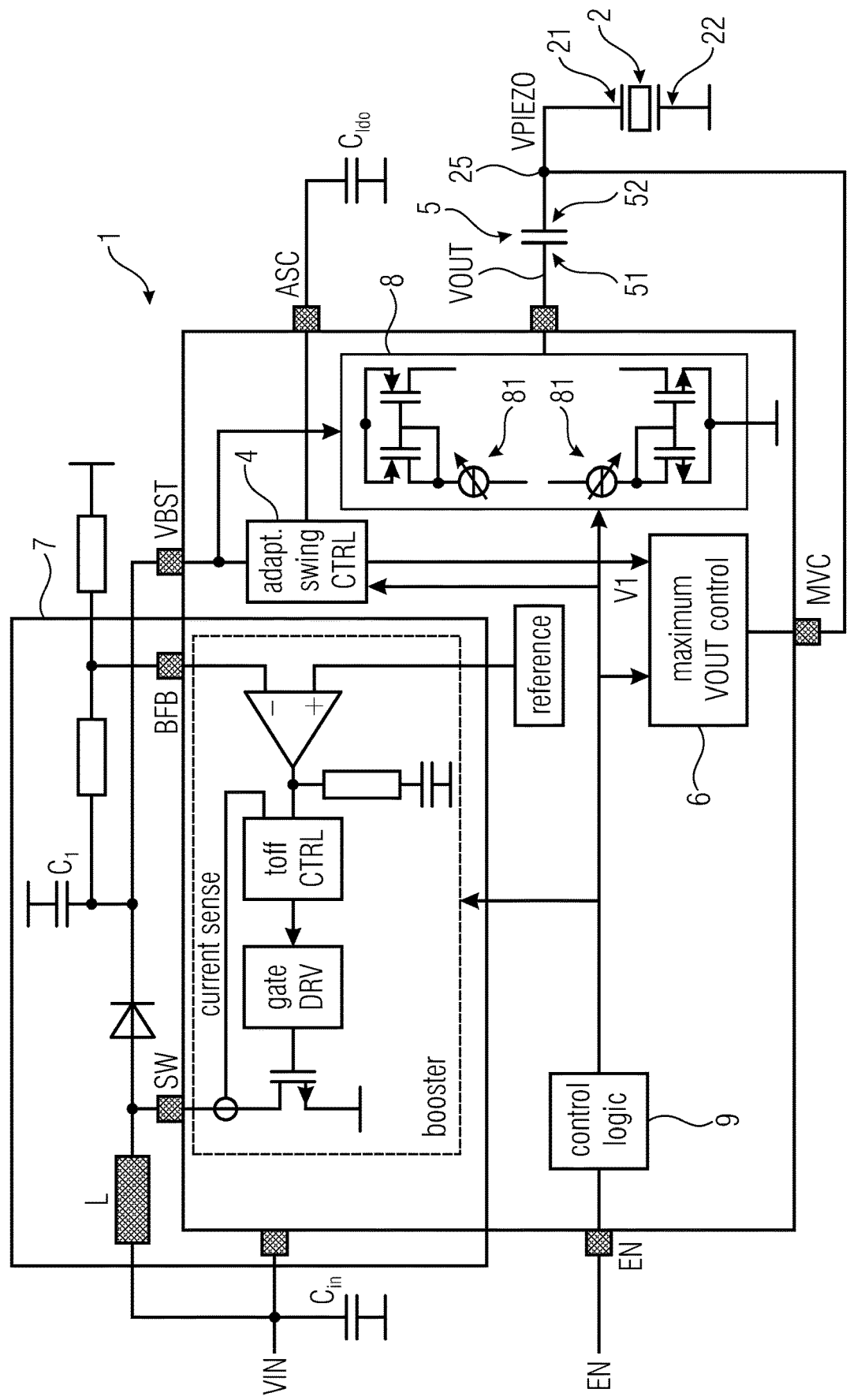
FIG. 6 shows a detailed illustration of a further embodiment of an apparatus.

In FIG. 6, the apparatus 1 is illustrated in more detail according to a further embodiment. The separation into the two areas mentioned above may also be seen very clearly.

The DC voltage converter 7 is partially integrated into an IC and comprises a few separate components which, for example, are too large for integration due to their dimensions. For example, these include the coil marked L, a diode and a few capacitances together with resistors.

The DC voltage converter 7 is supplied with the input voltage VIN—via the input designated the same way—and generates the drive voltage VBST. In addition, a unit (referred to as Reference) which delivers a reference value for controlling the DC voltage converter 7 is provided.

In addition, based on an input designated with EN, the DC voltage converter 7 is regulated via a controller 9 in order to, e.g., specify the magnitude of the positive amplitude of the drive voltage VBST to be generated.

The drive voltage VBST is supplied to the DC voltage source 4 and the controllable current source 8.

The DC voltage source 4 is here also referred to as "Adaptive Swing Control". The DC voltage source 4 may also be controlled via the controller 9, especially with regard to the magnitude of the DC voltage V1 to be generated. The DC voltage source 4 generates the DC voltage with the magnitude V1 which is supplied to the control apparatus 6, here also referred to as "Maximum Vout Control". Furthermore, the DC voltage source 4 contacts an external capacitor via an ASC output of the IC.

Via the control apparatus (an alternative designation would generally be: voltage-dependent switching apparatus) 6, on which the controller 9 also acts, and via an output designated with MVC, the DC voltage V1 is supplied to a node as a signal output 25. The node 25 is connected to the second contact 52 of the capacitor 5 and to the first contact 21 of the load 2, which is configured as a piezo actuator herein. Here, the second contact 22 of the load 2 is also connected to the ground.

Via the capacitor 5, the DC voltage V1 allows the reduction of the AC voltage VOUT present at the first contact 51 of the capacitor 5. The output signal VOUT is generated from the current source 8 based on the drive voltage VBST.

The current source 8 comprises two current mirrors as concrete embodiments of the current regulating circuits 81. These are transistor circuits with which a further current may be derived from an existing reference current. The current source 8 accordingly generates the output signal VOUT which is output here via an output of the IC.

The separate control—here indicated by the controller 9, or the interface EN of the IC—of the DC voltage source 4 and the AC voltage source 3 or at least one component 7, 8 allows to separately set the two voltages VBST and V1 to be generated and therefore also the shape of the AC voltage signal as drive signal VPIEZO for driving the load 2.

Figure 7:
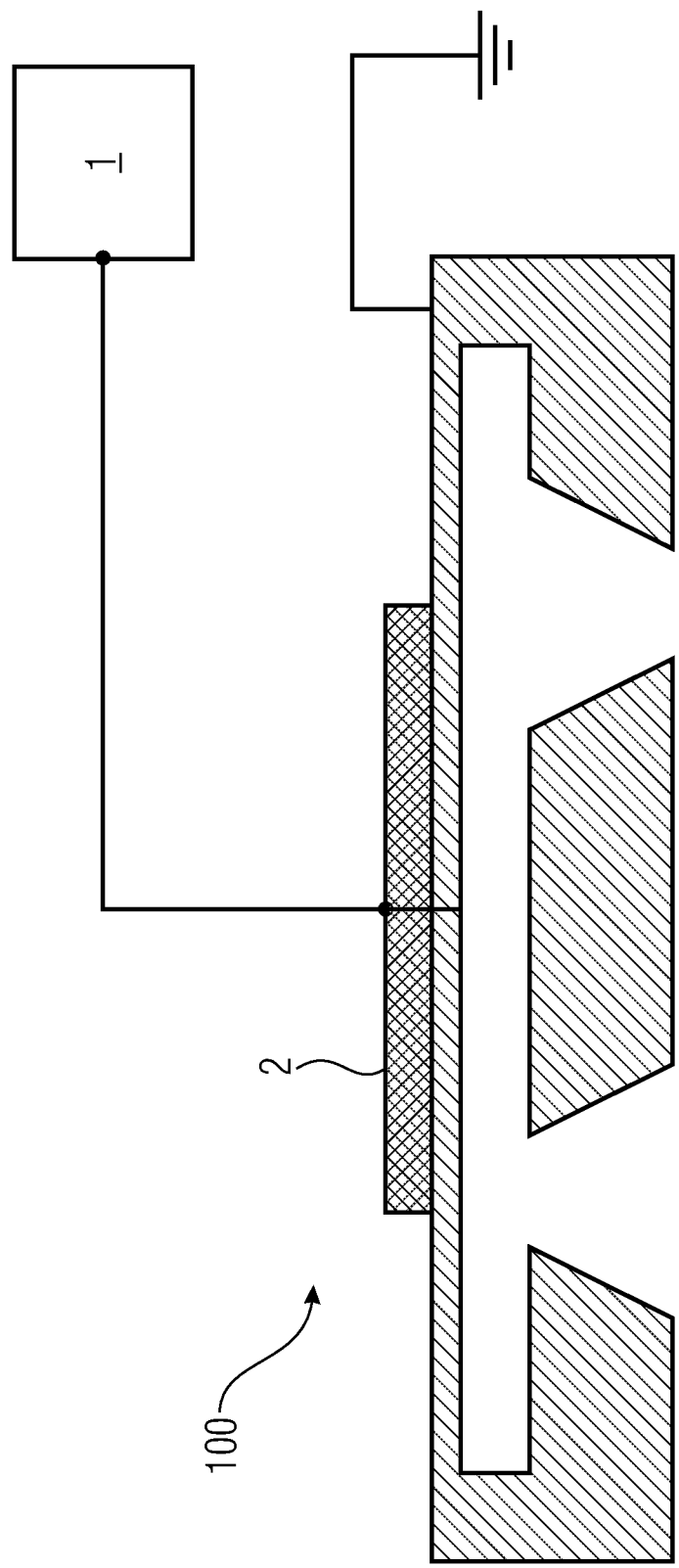
FIG. 7 shows a micropump as a device having an apparatus for driving a piezo actuator as a load.

FIG. 7 shows a micropump as an example of a device 100 comprising a diaphragm with a cavity adjacent to it. To convey a medium (which is not shown herein), a piezo actuator whose mechanical movements are transmitted to the diaphragm is mounted as the load 2 on the diaphragm. Driving the piezo actuator 2 with the AC voltage signal described above as the drive signal is carried out by the apparatus 1. Therefore, the above embodiments also apply here.

Furthermore, the diaphragm is electrically connected to the side of the piezo actuator 2 facing it and is electrically contacted to the ground so that the piezo actuator 2 is also connected on one side to the ground.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be by a hardware device (or using a hardware device), such as a microprocessor, a programmable computer or an electronic circuit. In some embodiments, some or several of the most important method steps may be performed by such a device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The research that led to these results was supported by the European Union.

The invention claimed is:

1. An apparatus for driving a load with a drive signal, the apparatus comprising an AC voltage source, a DC voltage source, a capacitor and a control apparatus,
wherein the AC voltage source is configured to output an AC voltage,
wherein the DC voltage source is configured to output a DC voltage with a predeterminable magnitude,
wherein the capacitor comprises a first terminal and a second terminal,
wherein the AC voltage source is connected to the first terminal,
wherein a signal output is connected to the second terminal, and
wherein the control apparatus is configured to control, depending on a voltage present at the signal output, a connection between the DC voltage source and the second terminal.

2. Apparatus according to claim 1,
wherein the drive signal is an AC voltage signal with a positive amplitude and a negative amplitude,
wherein a magnitude of the positive amplitude of the drive signal depends on the magnitude of the DC voltage of the DC voltage source, and
wherein a magnitude of the negative amplitude of the drive signal depends on a magnitude of a difference between a magnitude of a positive amplitude of the AC voltage of the AC voltage source and the magnitude of the DC voltage of the DC voltage source.

3. Apparatus according to claim 1,
wherein the magnitude of the DC voltage of the DC voltage source is smaller than a magnitude of a positive amplitude of the AC voltage of the AC voltage source.

4. The apparatus according to claim 1,
wherein the control apparatus is configured to connect the DC voltage source to the second terminal if the voltage present at the signal output is larger than or equal to the DC voltage of the DC voltage source.

5. The apparatus according to claim 1,
wherein the AC voltage source comprises a controllable current source,
wherein the current source is configured to generate an AC current, and
wherein the current source is connected to the first terminal of the capacitor.

6. The apparatus according to claim 5,
wherein the current source comprises at least two current regulating circuits.

7. The apparatus according to claim 5,
wherein the AC voltage source comprises a DC voltage converter,
wherein the DC voltage converter is configured to, based on a DC voltage, generate a drive voltage, and
wherein the drive voltage generated by the step-up converter is supplied to the current source.

8. The apparatus according to claim 1,
wherein the AC voltage source is configured such that the AC voltage that is output is free of a negative amplitude.

9. The apparatus according to claim 8,
wherein the AC voltage source is configured such that the AC voltage that is output comprises a positive amplitude and an amplitude with 0 volts.

10. The apparatus according claim 1,
wherein the load is connected to a ground.

11. The apparatus according claim 1,
wherein the control apparatus comprises at least one rectifier.

12. The apparatus according claim 1,
wherein the control apparatus comprises at least one diode which is connected on the cathode side to the DC voltage source and on the anode side to the signal output.

13. A device comprising at least a load and an apparatus for driving the load with a drive signal,
wherein the apparatus comprises an AC voltage source, a DC voltage source, a capacitor and a control apparatus,
wherein the AC voltage source is configured to output an AC voltage,
wherein the DC voltage source is configured to output a DC voltage with a predeterminable magnitude,
wherein the capacitor comprises a first terminal and a second terminal,
wherein the AC voltage source is connected to the first terminal,
wherein a signal output is connected to the second terminal, and
wherein the control apparatus is configured to control, depending on a voltage present at the signal output, a connection between the DC voltage source and the second terminal.

14. The device according to claim 13,
wherein the apparatus is configured according to claim 2.

15. The device according to claim 13,
wherein the load is a piezo actuator.

16. The device according to claim 13,
wherein the device is configured as a micropump.

* * * * *